(12) United States Patent
Kiryu et al.

(10) Patent No.: US 6,866,890 B2
(45) Date of Patent: Mar. 15, 2005

(54) METHOD OF FORMING A DIELECTRIC FILM

(75) Inventors: Hideki Kiryu, Sagamihara (JP);
Shintaro Aoyama, Nirasaki (JP);
Tsuyoshi Takahashi, Nirasaki (JP);
Hiroshi Shinriki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 119 days.

(21) Appl. No.: 10/239,648

(22) PCT Filed: Mar. 22, 2001

(86) PCT No.: PCT/JP01/02262

§ 371 (c)(1),
(2), (4) Date: Dec. 6, 2002

(87) PCT Pub. No.: WO01/75956

PCT Pub. Date: Oct. 11, 2001

(65) Prior Publication Data

US 2004/0005408 A1 Jan. 8, 2004

(30) Foreign Application Priority Data

Mar. 30, 2000  (JP) ........................................ 2000-095818

(51) Int. Cl.[7] .............................................. C23C 16/40
(52) U.S. Cl. ............................ 427/255.31; 427/255.34; 427/255.36; 427/255.7; 438/761
(58) Field of Search ....................... 427/255.31, 255.34, 427/255.36, 255.7; 438/761, 253, 769

(56) References Cited

U.S. PATENT DOCUMENTS

| | | | |
|---|---|---|---|
| 5,521,423 A | 5/1996 | Shinriki et al. | |
| 5,837,593 A | 11/1998 | Park et al. | |
| 5,858,843 A | 1/1999 | Doyle et al. | |
| 5,939,131 A | 8/1999 | Kim et al. | |
| 6,020,243 A * | 2/2000 | Wilk et al. | 438/287 |
| 6,110,772 A * | 8/2000 | Takada et al. | 438/238 |
| 6,258,690 B1 * | 7/2001 | Zenke | 438/396 |
| 6,342,712 B1 * | 1/2002 | Miki et al. | 257/295 |
| 6,436,849 B1 * | 8/2002 | Hasunuma et al. | 438/778 |
| 6,558,747 B2 * | 5/2003 | Nakata et al. | 427/387 |
| 6,589,644 B1 * | 7/2003 | Yamada et al. | 428/312.6 |
| 6,639,015 B1 * | 10/2003 | Nakashima et al. | 525/106 |
| 6,699,797 B1 * | 3/2004 | Morris et al. | 438/778 |

FOREIGN PATENT DOCUMENTS

| | | |
|---|---|---|
| EP | 0641027 | 3/1995 |
| GB | 1311685 | 3/1973 |
| JP | 06310687 | 11/1994 |
| WO | 99/39384 | 8/1999 |

OTHER PUBLICATIONS

Kamiyama Satoshi, eta l., "Highly reliable 2.5NM TAO5 capacitor process technology for 265MBIT drams" Proceedings of the International Election Devices Meeting, Washington, DC., Dec., 1991, pp. 91–827–91–830.

G. Lo, et al., "Metal–oxide–semiconductor characters of chemical vapor deposited TA2O5 films" Applied Physics Letters, American Institute of Physics, Jun. 29, 1992, vol. 60, No. 26, pp. 3286–3288.

(List continued on next page.)

*Primary Examiner*—Bret Chen
(74) *Attorney, Agent, or Firm*—Crowell & Moring LLP

(57) ABSTRACT

A method of forming a dielectric film on a Si substrate comprises the steps of adsorbing a gaseous molecular compound of a metal element constituting a dielectric material on a Si substrate, and causing a decomposition of the gaseous molecular compound thus adsorbed by a hydrolysis process or pyrolytic decomposition process or an oxidation process.

30 Claims, 10 Drawing Sheets

OTHER PUBLICATIONS

H. Treichel, et al., "Low–pressure chemical vapour deposition of tantalum pentoxide films for ULSI devices using tantalum pentaethoxide as precursor" Advanced Materials for Optics and Electronics, Dec. 1, 1992, vol. 1, No. 6, pp. 299–308.

Isobe Chiharu, et al., "Effect of ozone annealing on the dielectric properties of tantalum oxide thin films grown by chemical vapor deposition" Applied Physics Letters, American Institute of Physics, Mar. 5, 1990, vol. 56, No. 10, pp. 907–909.

W. R. Hitchens, et al., "Tantalum oxide thin films for dielectric applications by low–pressure chemical vapor deposition" Journal of the Electrochemical Society, Sep. 1, 1993, vol. 140, No. 9, pp. 2615–2621.

G. Lo, et al., "Highly reliable, high–C dram storage capacitors with CVD TA2O5 films on rugged polysilicon" IEEE Electron Device Letters, May 1, 1993, vol. 14, No. 5, pp. 214–218.

* cited by examiner

FIG.5

| | SOURCE | Ta(OC₂H₅)₅ | TaCl₅ | Zr(t-OC₄H₉)₄ | ZrCl₄ | Al(i-OC₃H₇)₃ | (CH₃)₃Al | SiCl₄ | Si(OC₂H₅)₄ |
|---|---|---|---|---|---|---|---|---|---|
| ADSORB PROCESS | VACUUM | 0.001~0.1torr | 0.01~0.1torr | 0.01~0.1torr | 0.01~0.1torr | 0.01~0.1torr | 0.01~0.1torr | 0.01~0.1torr | 0.01~0.1torr |
| | GAS FLOWRATE | 0.1~5mg/min | 0.1~5mg/min | 0.1~5mg/min | 0.1~5mg/min | 0.1~5mg/min | 0.1~5mg/min | 0.1~5mg/min | 0.1~5mg/min |
| | TEMPERATURE | 200~350℃ | ↓ | ↓ | ↓ | ↓ | ↓ | ↓ | ↓ |
| OXIDIZE PROCESS | H₂O | 200~350℃, 10~0.001torr | ↓ | ↓ | ↓ | ↓ | ↓ | ↓ | ↓ |
| | NO₂ | 200~350℃, 10~0.001torr | ↓ | ↓ | ↓ | ↓ | ↓ | ↓ | ↓ |
| | O₂ | 300~400℃, 10~0.001torr | ↓ | ↓ | ↓ | ↓ | ↓ | ↓ | ↓ |
| | O₃ | 200~300℃, 10~0.001torr | ↓ | ↓ | ↓ | ↓ | ↓ | ↓ | ↓ |

FIG.6

| CVD PROCESS | | | | | | |
|---|---|---|---|---|---|---|
| COMPOSITION | $Ta_2O_5$ | $ZrO_2$ | $HfO_2$ | | $SiO_2$ | $Al_2O_3$ |
| TEMPERATURE | 400~600°C | ↓ | ↓ | | ↓ | ↓ |
| SOURCE | $Ta(OC_2H_5)_5$ | $Zr(t\text{-}OC_4H_9)_4$ | $Hf(C_5H_7O_2)_4$ | | $Si(OC_2H_5)_5$ | $Al(i\text{-}OC_3H_7)_3$ |
| OXIDATION GAS | $O_2$ | ↓ | ↓ | | ↓ | ↓ |

Pressure: 0.1~10 torr

METHOD OF FORMING A DIELECTRIC FILM

TECHNICAL FIELD

The present invention generally relates to semiconductor devices and more particularly to a fabrication process of ultrafine and ultrahigh-speed semiconductor devices.

BACKGROUND ART

With advancement in the art of device miniaturization, it is now becoming possible to use a gate length of 0.1 μm or less in leading-edge, ultrahigh-speed semiconductor devices. With increase in the degree of device miniaturization, it is well known that there occurs an increase of the operational speed. On the other hand, in order to achieve such an increase of operational speed by way of device miniaturization, there is a requirement, from scaling law, to reduce the thickness of a gate insulation film used therein in proportion with the reduction of a gate length of the semiconductor device.

In the case of ultrafine and ultrahigh-speed semiconductor devices having the gate length of 0.1 μm or less, it is thus necessary to reduce the thickness of the gate electrode to 1–2 nm or less, provided that $SiO_2$ is used for the material of the gate insulation film. However, the use of such an extremely thin gate insulation film inevitably causes the problem of increase of leakage current caused by the tunneling effect through the thin gate insulation film.

Thus, in order to avoid the foregoing problem associated with the use of the $SiO_2$ film, there is proposed in Japanese Laid-Open Patent Publication 11-87341 a process of forming a thin SiN gate insulation film on the surface of a Si substrate in place of a $SiO_2$ gate insulation film, by first adsorbing a gaseous source material containing Si on the surface of the Si substrate, and then applying an atmosphere containing nitrogen radicals to the substrate surface on which the gaseous source material is adsorbed. According to the foregoing proposal, the physical thickness of the gate insulation film can be increased while reducing the electrical or equivalent thickness of the gate insulation film by using SiN, which has a larger specific dielectric constant than $SiO_2$, for the gate insulation film.

This prior art process, however, is not effective for eliminating the foregoing problem of tunneling leakage current. Although SiN has a specific dielectric constant of about 8, which is certainly larger than the specific constant of 4 for $SiO_2$, this value is not sufficient for achieving the desired increase of the physical thickness of the gate insulation film while eliminating the tunneling current.

The process of the foregoing prior art has a further drawback, in relation to the use of the nitrogen radicals, in that it requires a plasma process for exciting the nitrogen radicals. When the substrate surface is processed in the vicinity of a plasma source, charged particles forming the plasma such as electrons or ions are incorporated into the SiN film and form impurity states therein. When such impurity states are formed in the gate insulation film, the leakage current in the gate insulation film is increased and the CV characteristic is degraded. When the plasma source is provided at a remote location away from the substrate so as to avoid the foregoing problem, on the other hand, the number of the nitrogen radicals is reduced at the surface of the substrate and the adsorption of nitrogen becomes difficult.

In view of the situation noted above, there is a proposal to use a high-dielectric material such as $Ta_2O_5$ for the material of the gate insulation film. It should be noted that these high-dielectric materials have a far larger specific dielectric constant as compared with $SiO_2$. By using such a high-dielectric material, it becomes possible to effectively reduce the equivalent thickness of the insulation film, which is an electrically equivalent thickness converted to the thickness of a $SiO_2$ film, while simultaneously using a large physical thickness. By using such a high-dielectric gate insulation film, it becomes possible to use a physical thickness of about 10 nm for the gate insulation film of ultrafine and ultrahigh-speed semiconductor devices having a gate length of 0.1 μm or less, while successfully suppressing the gate leakage current caused by tunneling effect.

It has been known that a $Ta_2O_5$ film can be formed by a CVD process that uses $Ta(OC_2H_5)_2$ and $O_2$ as gaseous source. In a typical example, the CVD process is conducted under a reduced pressure environment at a temperature of 480° C. or more. The $Ta_2O_5$ film thus formed is then annealed in an oxidizing atmosphere for compensating for oxygen defects and for crystallization of the film. The $Ta_2O_5$ film thus crystallized shows a very large specific dielectric constant.

When growing a high-dielectric film such as $Ta_2O_5$ on a Si substrate by a CVD process, it is known that the growth of the high-dielectric film does not start immediately after the commencement of the CVD process due to a delay caused by nucleation process and that the growth starts only after a certain incubation time has elapsed.

In the experimental investigation that constitutes the foundation of the present invention, the inventor of the present invention has discovered that the incubation time varies depending on the nature of the layer on which the high-dielectric film is deposited. For example, the incubation time becomes very short when the deposition is made on a clean surface of a Si substrate from which oxide is removed. When there is an insulating film of $SiO_2$ or a SiN or SiON on a Si substrate, on the other hand, a remarkable increase of the incubation time was observed. Further, it was discovered that the incubation time changes also depending on the thickness of the $SiO_2$ film or SiN film or the SiON film existing on the surface of the Si substrate.

The foregoing discovery means that the thickness of the high-dielectric film formed on a $SiO_2$ film or on a SiN film or on a SiON film on a Si substrate tends to reflect the variation of thickness of the underlying layer and that there may be a case in which the variation of the thickness of the underlying layer may be amplified by the high-dielectric film. Further, the observed fact that the thickness of the high-dielectric film thus formed by a CVD process is affected by the nature of the underlying layer indicates that the quality of the high-dielectric film thus formed for the gate insulation film may lack the desired homogeneity.

In order to suppress the occurrence of inhomogeneity in such high-dielectric film, it is necessary as well as desired to reduce the incubation time as much as possible.

Meanwhile, in such a semiconductor device that uses a high-dielectric film for the gate insulation film, it is necessary as well as desired to provide a thin oxide film between the Si substrate and the high-dielectric gate insulation film for eliminating the diffusion of metal elements or impurity elements into the substrate forming the channel region of the semiconductor device from or through the high-dielectric film. Otherwise, there may be caused a problem of carrier scattering in the channel region by the metal elements.

On the other hand, such an intervening oxide film has to be extremely thin. When a thick oxide film is interposed between the Si substrate and the high-dielectric film, the effect of the high-dielectric film would be canceled out. In addition, there is a demand for a technology to change a film quality such as composition in the thickness direction of the high-dielectric film.

DISCLOSURE OF THE INVENTION

Accordingly, it is a general object of the present invention to provide a novel and useful method of forming a dielectric film wherein the foregoing problems are eliminated.

Another and more specific object of the present invention is to provide a method of forming a dielectric film by a vapor phase deposition process without causing damages in the dielectric film by charged particles while minimizing the incubation time for deposition of the dielectric film and simultaneously reducing the surface roughness.

Another object of the present invention is to provide a method of forming a dielectric film by a vapor phase deposition process without causing damages in the dielectric film by charged particles while arbitrarily controlling a compositional profile of the dielectric film in a thickness direction thereof.

Another object of the present invention is to provide a method of forming a dielectric film on a Si substrate, comprising the steps of:

exposing a surface of said Si substrate;

forming an insulating layer on said exposed surface of said Si substrate;

causing an adsorption of a gaseous molecular compound of a metal element constituting a dielectric material at least once on said surface of said Si substrate on which said insulating layer has been formed, such that said gaseous molecular compound covers substantially uniformly over said surface of said Si substrate; and forming a molecular layer of said dielectric material containing said metal element on said surface of said Si substrate, by causing a hydrolysis reaction in said gaseous molecular compound covering said surface of said Si substrate.

Another object of the present invention is to provide a method of forming a dielectric film on a Si substrate, comprising the steps of:

exposing a surface of said Si substrate;

forming an insulating layer on said exposed surface of said Si substrate;

causing an adsorption of a gaseous molecular compound of a metal element constituting a dielectric material at least once on said insulating layer, such that said gaseous molecular compound covers substantially uniformly over said insulating layer; and forming a molecular layer of said dielectric material containing said metal element on said insulating layer, by causing a pyrolytic decomposition of said gaseous molecular compound covering said insulating layer, said step of causing a pyrolytic decomposition comprising the step of heating said Si substrate to a temperature exceeding a pyrolytic decomposition temperature of said gaseous molecular compound in an oxidizing atmosphere.

Another object of the present invention is to provide a method of forming a dielectric film on a Si substrate, comprising the steps of:

exposing a surface of said Si substrate;

forming an insulating layer on said exposed surface of said Si substrate;

causing an adsorption of a gaseous molecular compound of a metal element constituting a dielectric material at least once on said insulating layer, such that said gaseous molecular compound covers substantially uniformly over said insulating layer; and forming a molecular layer of said dielectric material containing said metal element on said insulating layer, by exposing said gaseous molecular compound to an atmosphere selected from the group consisting of $H_2O$, $O_3$ and $NO_2$.

According to the present invention, it becomes possible to form a dielectric or high-dielectric film of various compositions including $Ta_2O_5$ on a Si substrate by a CVD process with reduced incubation time. As a result, the uniformity of the obtained dielectric film is improved. Further, the present invention enables arbitrary control of composition of the dielectric film in the thickness direction thereof. According to the needs, it is also possible to form an extremely thin diffusion barrier film of about a single molecular layer thickness inside the dielectric film. In view of the fact that the present invention does not include the step of using plasma-excited radials, the dielectric film thus formed according to the process of the present invention is substantially free form defects having electric charges such as impurity states, and excellent leakage characteristics can be attained.

As a result of the present invention, a ultrafine and ultrahigh-speed semiconductor device having a gate length of 0.1 $\mu$m or less can be formed while successfully suppressing the gate leakage current.

Other objects and further features of the present invention will become apparent from the following detailed description when read in conjunction with the attached drawings.

BRIEF DESCRIPTION OF THE DRAWINGS

FIG. 5 is a diagram showing the process conditions used in the present embodiment and in various modifications thereof;

FIG. 6 is a further diagram showing the process conditions used in the present embodiment and in various modifications thereof;

BEST MODE OF IMPLEMENTING THE INVENTION

[First Embodiment]

FIGS. 1A–1H show the process of forming a $Ta_2O_5$ film according to a first embodiment of the present invention.

Figure 1A:
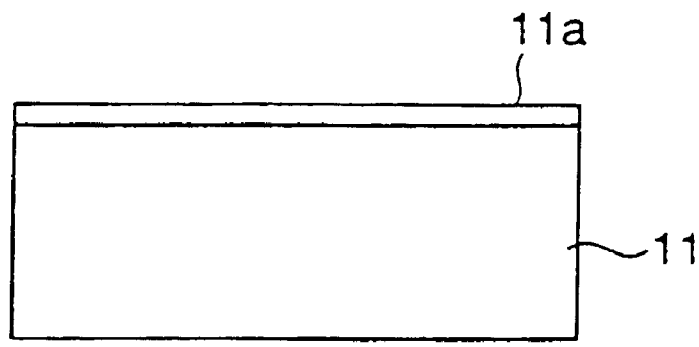
FIGS. 1A–1H are diagrams showing the process of forming a dielectric film according to a first embodiment of the present invention.

Referring to FIG. 1A, a Si substrate 11 is held in a reaction vessel (not shown) under a reduced pressure environment of 133–399 Pa (1–3 Torr) at a temperature lower than a room temperature, and an oxide film 11a on the surface of the substrate 11 is removed by supplying nitrogen radicals N* and hydrogen radicals H* formed as a result of plasma activation of a gas mixture of $N_2$ and $H_2$ into the reaction vessel together with a $NF_3$ gas. By conducting such a removal of the oxide film at low temperature, there is formed a protective film 11b having a composition of N—O—Si—H on the surface of the Si substrate 11. In a typical example, the $H_2$ gas, the $NF_3$ gas and the $N_2$ gas are supplied with respective flow rates of 10 sccm, 30 sccm and 100 sccm, and the activation of the $H_2$ gas and the $N_2$ gas is achieved by applying a plasma power of about 50 W. The process of FIG. 1A may be continued for a duration of 3 minutes or less.

Figure 1B:
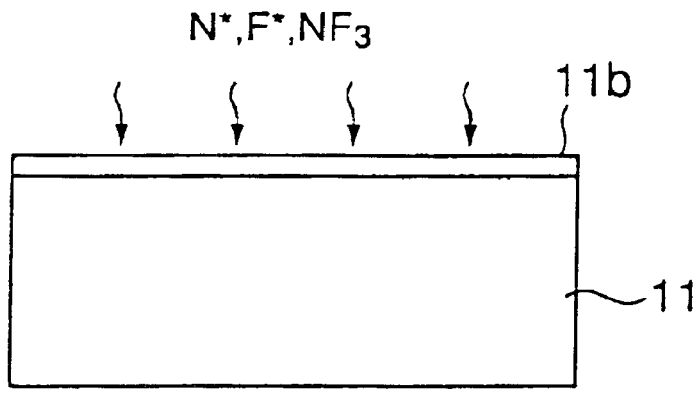

The protective film 11b thus formed is a volatile film and easily undergoes vaporization by causing sublimation in the step of FIG. 1C when the Si substrate 11 is annealed subsequently to the step of FIG. 1B in the same reaction vessel under the reduced pressure environment at a temperature of about 120° C. As a result a fresh surface 11c of the Si substrate 11 is exposed.

Figure 1C:
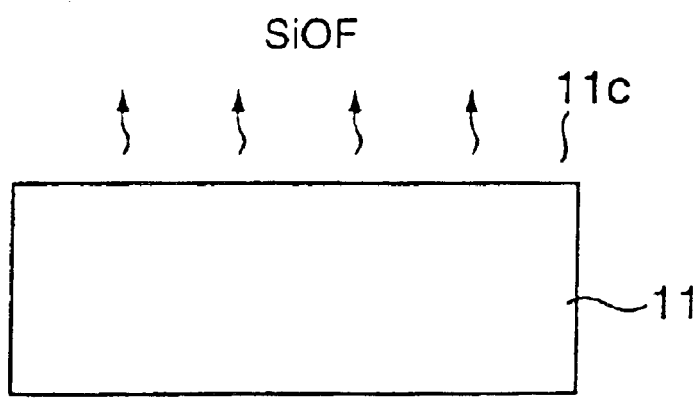
Figure 1D:
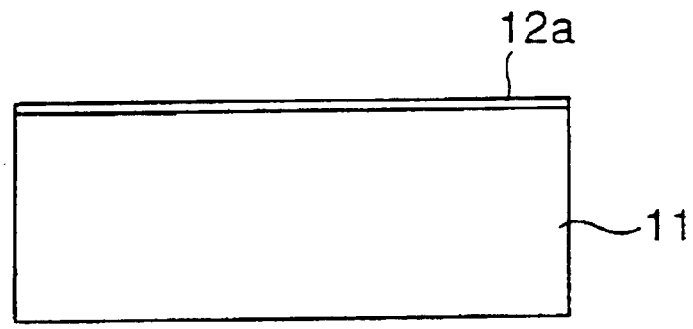

Next, in the step of FIG. 1D, which is continued from the step of FIG. 1C, the pressure inside the reaction vessel is set to 1.33–13.3 Pa (0.01–0.1 Torr) and the substrate temperature is set to 200–350° C. In this state, a $SiCl_4$ gas is introduced into the reaction vessel with a flow rate of 0.1–5 mg/min together with a He carrier gas, which is supplied to the reaction vessel with a flow rate of about 50 sccm. In this step, $SiCl_4$ molecules thus introduced with the $SiCl_4$ gas cause adsorption on the foregoing fresh surface 11c of the Si substrate 11.

In the step of FIG. 1D, an $H_2O$ vapor is then introduced into the reaction vessel with a flow rate of about 1 sccm together with the He carrier gas, wherein the $H_2O$ vapor thus introduced causes a hydrolysis reaction in the $SiCl_4$ molecules absorbed on the surface 11c of the Si substrate 11. As a result, there is formed an extremely thin $SiO_2$ molecular layer 12a containing one to several layers of $SiO_2$ molecules on the surface of the Si substrate 11. By repeating the process of introducing the $SiCl_4$ gas and the process of hydrolysis of the absorbed $SiCl_4$ molecules in the step of FIG. 1D, it is possible to form the $SiO_2$ molecular layer 12a to have a desired thickness.

In the step of FIG. 1D, it is also possible to use a $SiH_2Cl_2$ gas or a $Si(C_2H_5)_4$ gas in place of the $SiCl_4$ gas.

In the step of FIG. 1D, it should also be noted that the $SiO_2$ molecular layer 12a may be replaced by a SiN molecular layer by processing the adsorbed $SiCl_4$ molecules by a $NH_3$ gas. Further, it is possible to form an SiON molecular layer by stacking the $SiO_2$ molecular layer and the SiN molecular layer as desired. Further, it is also possible to form a thermal oxide film in view of availability of abundant data for process control.

Figure 1E:
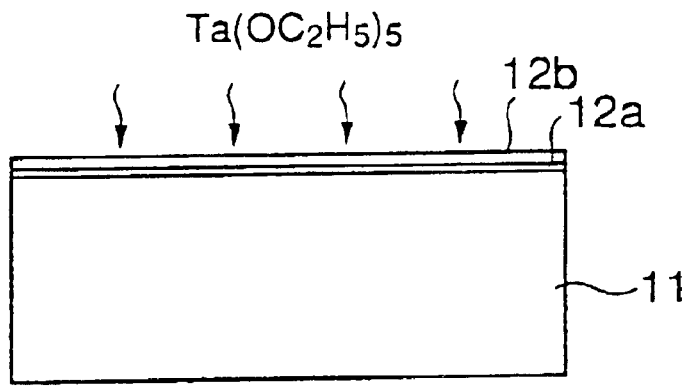

Next, in the step of FIG. 1E, the substrate temperature is set to 350° C. or less, preferably about 300° C. or less, most preferably to about 280° C., and a $Ta(OC_2H_5)_5$ gas and an $O_2$ gas are supplied to the reaction vessel held at a pressure of 0.01–0.1 Torr similarly as before, together with a He carrier gas with respective flow rates of about 5 mg/min and 100 sccm for about 1 minute. The flow rate of the He carrier gas is set to about 100 sccm. As a result, the $Ta(OC_2H_5)_5$ molecules are adsorbed on the $SiO_2$ layer 12a in the form of a $Ta(OC_2H_5)_5$ molecular layer 12b.

Figure 1F:
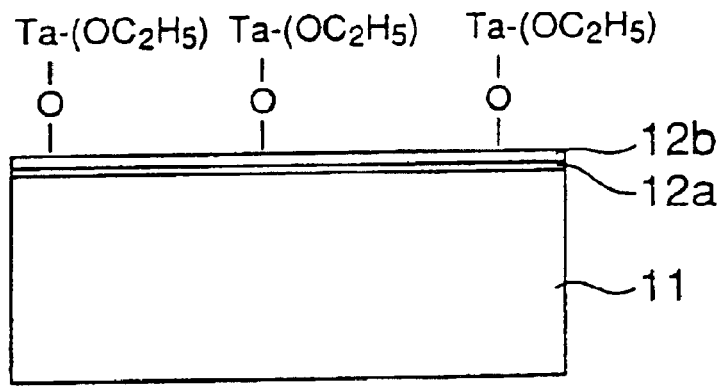
Figure 1G:
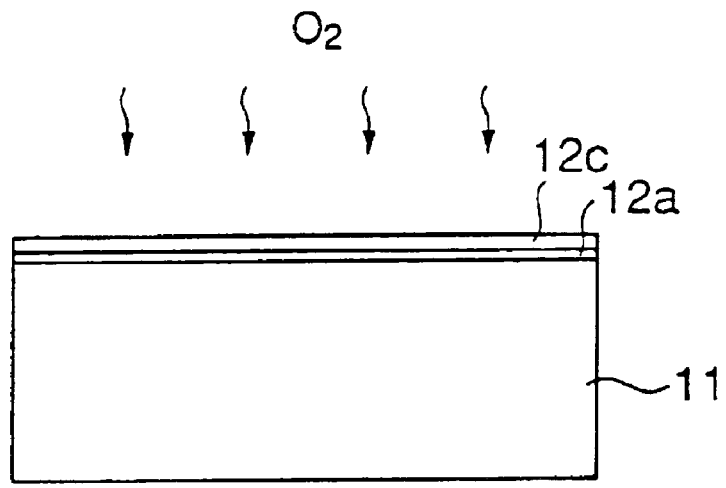

Next, in the step of FIG. 1G, the substrate temperature is raised to about 350° C. in an oxidizing atmosphere and oxidation or hydrolysis reaction is caused in the adsorbed $Ta(OC_2H_5)_5$ molecules. As a result, the adsorbed molecular layer 12b of $Ta(OC_2H_5)O_5$ is converted into a $Ta_2O_5$ molecular layer 12c.

Figure 1H:
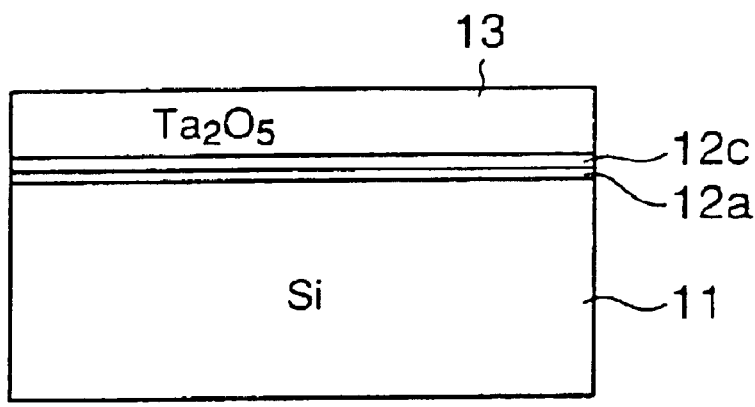

Further, in the step of FIG. 1H, the substrate temperature is raised to 510° C. and the internal pressure of the reaction vessel is set to 13.3–1330 Pa (0.1–10 Torr). Further, the $Ta(OC_2H_5)_5$ gas and the $O_2$ gas are introduced into the reaction vessel together with the He carrier gas and a $Ta_2O_5$ film 13 is formed on the $Ta_2O_5$ molecular layer 12c by an ordinary CVD process with a thickness of 4–5 nm.

While not illustrated, the $Ta_2O_5$ film 13 is subjected to a thermal annealing process conducted in an $O_2$ atmosphere for compensation of oxygen defects and crystallization. The $Ta_2O_5$ film 13 thus crystallized shows a large specific dielectric constant. In view of the fact that the $SiO_2$ molecular layer 12a is interposed at the interface between the Si substrate 11 and the $Ta_2O_5$ film 13, a large carrier mobility is guaranteed for the semiconductor device formed on the Si substrate. In other words, the semiconductor device formed according to the present invention operates at a very high speed.

Figure 2:
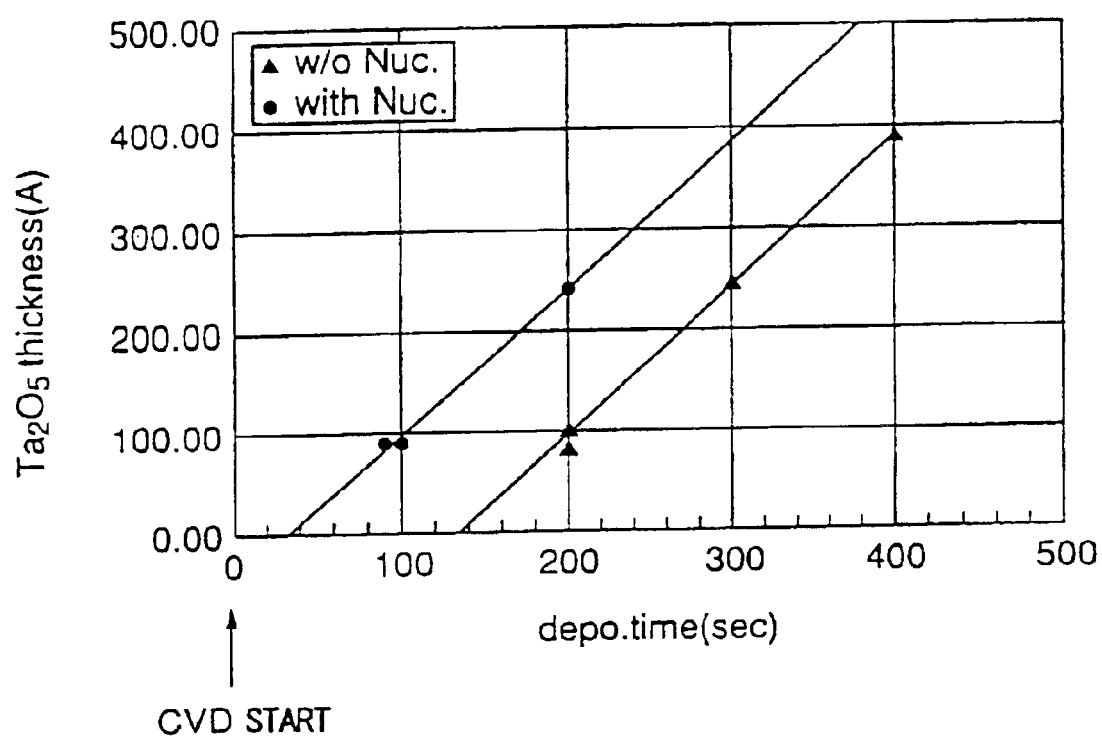
FIG. 2 is a diagram showing the effect of the present invention.

FIG. 2 shows the relationship between the duration of the deposition process in the CVD step of FIG. 1H and the thickness of the $Ta_2O_5$ film 13 thus formed, in comparison with a conventional CVD process of a $Ta_2O_5$ film. In FIG. 2, it should be noted that the deposition time is measured from the point of commencement of the CVD process In FIG. 2, ● represents the deposition of the $Ta_2O_5$ film according to the present embodiment, while ▲ represents the deposition of the $Ta_2O_5$ film according to the conventional CVD process. In the conventional experiments represented by ▲, it should be noted that the CVD deposition of the $Ta_2O_5$ film is conducted directly on the $SiO_2$ molecular layer 12a.

Referring to FIG. 2, it can be seen that there exists an incubation time of about 140 seconds from the start of the CVD process until actual deposition of the $Ta_2O_5$ film is caused, while in the case of the present invention, the deposition of the $Ta_2O_5$ film is already started after 40 seconds from the commencement of the CVD process. Thus, the present invention can substantially reduce the incubation time at the time of forming a $Ta_2O_5$ film by a CVD process.

Figure 3A:
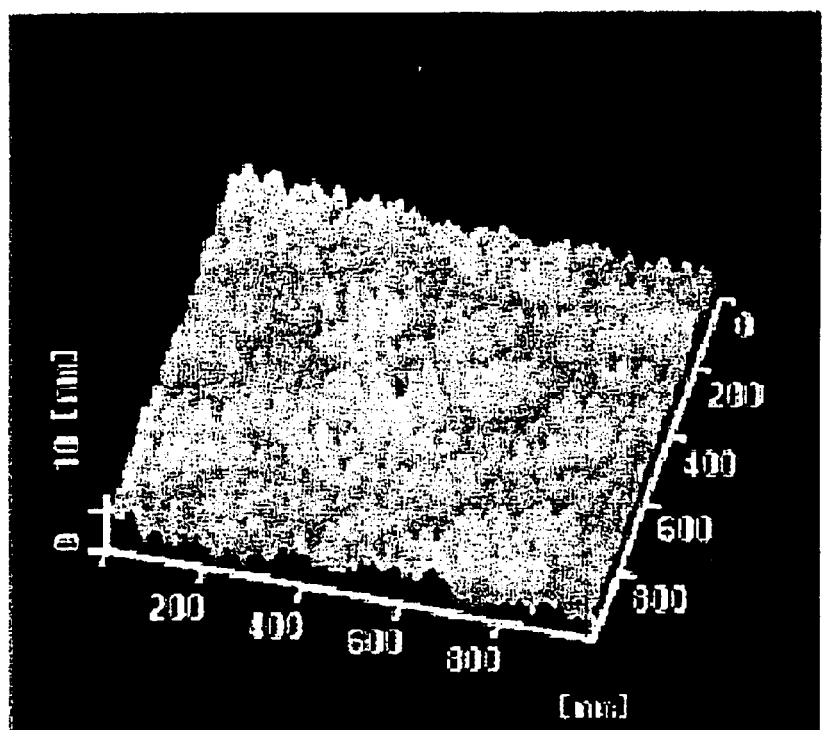
FIGS. 3A and 3B are diagrams showing a surface structure of a $Ta_2O_5$ film formed on a SiON film according to a conventional CVD process.
Figure 3B:
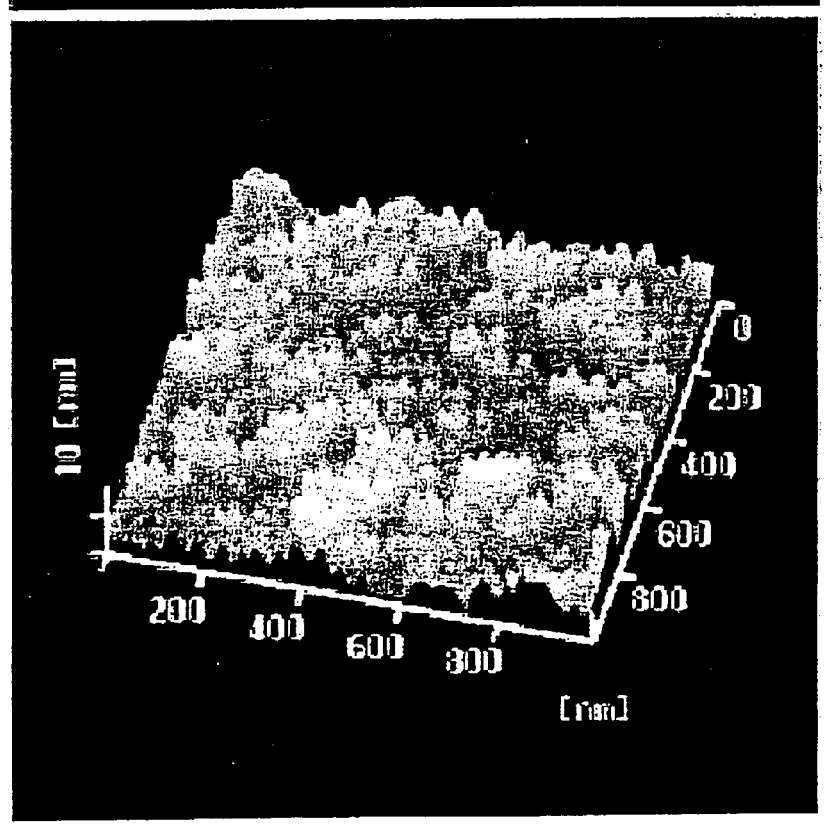

FIGS. 3A and 3B show the result of an AFM (atomic-force microscope) observation of the surface of the $Ta_2O_5$ film formed on a SiON film covering the surface of the Si substrate by a conventional CVD process, wherein FIG. 3A represents the case in which the CVD process of the $Ta_2O_5$ film is conducted at the substrate temperature of 510° C., while FIG. 3B represents the case in which the CVD process of the $Ta_2O_5$ film is conducted at the substrate temperature of 480° C.

Referring to FIGS. 3A and 3B, the CVD-$Ta_2O_5$ film thus formed has a very large variation of film thickness reflecting the variation of the film thickness of the underlying SiON film. In other words, there occurs an amplification of thickness variation of the underlying layer in the conventional CVD-$Ta_2O_5$ film and the homogeneity of the obtained $Ta_2O_5$ film becomes inevitably deteriorated.

Figure 4A:
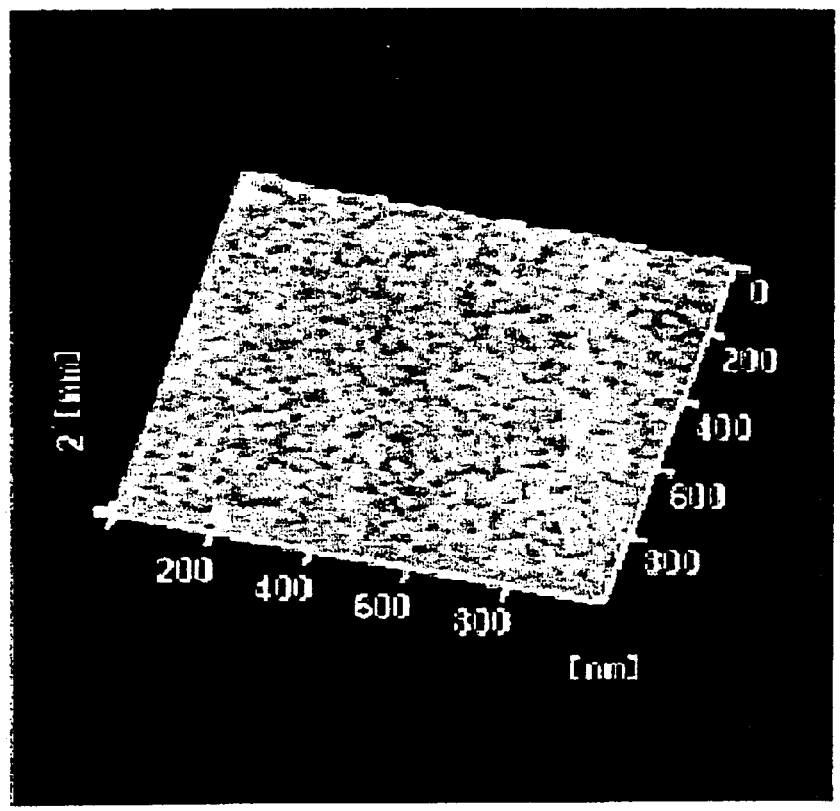
FIGS. 4A and 4B are diagrams respectively showing the surface structure of a $Ta_2O_5$ film formed on a SiON substrate according to a process of the present invention and the surface structure of a $Ta_2O_5$ film formed directly on a Si substrate surface.
Figure 4B:
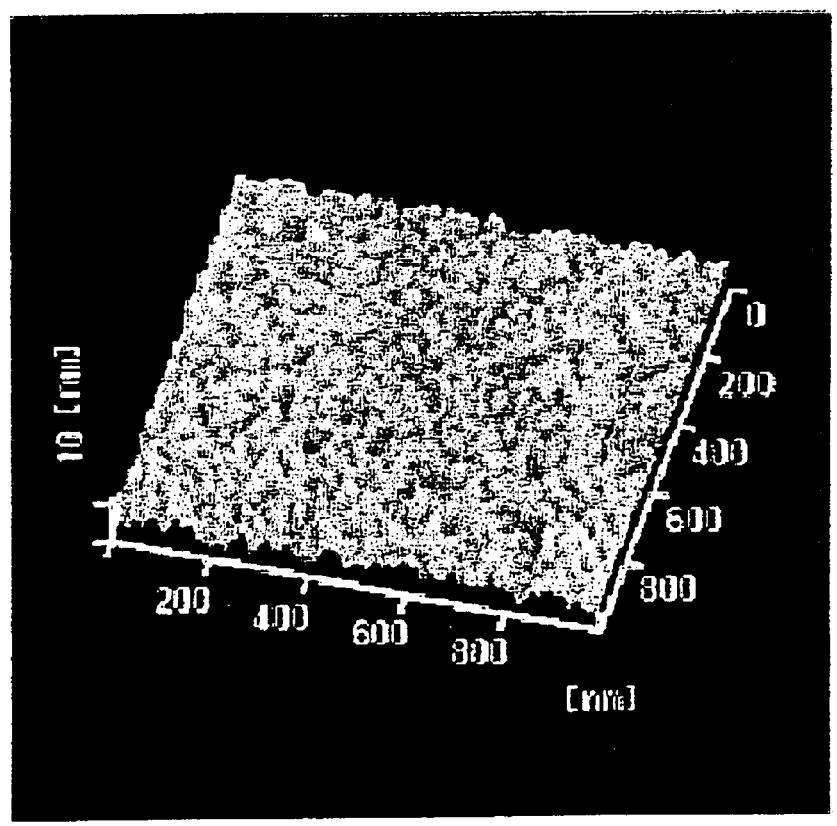

FIG. 4A, on the other hand, shows the surface of the $Ta_2O_5$ film formed according to the present embodiment explained with reference to FIGS. 1A–1H, wherein it should be noted that the $Ta_2O_5$ film is formed not on the $SiO_2$ molecular layer 12a but on an SiON molecular layer. FIG. 4B, on the other hand, shows the surface of the $Ta_2O_5$ film deposited directly on the exposed surface 11c of the Si substrate 11. In any of FIGS. 4A and 4B, the surface structure of the $Ta_2O_5$ film was observed by an AFM.

Referring to FIG. 4A, it can be seen that the projections and depressions on the $Ta_2O_5$ film formed by the CVD process is reduced substantially by employing the process of the present invention. In other words, FIG. 4A indicates that it is possible to obtain a $Ta_2O_5$ film having a surface similar to that of the film formed directly on a Si substrate by employing the process of the present invention. It is believed that this advantageous result of FIG. 4A reflects the decrease of the incubation time achieved as a result of conducting the CVD process of the $Ta_2O_5$ film 13 on the $Ta_2O_5$ molecular layer 12c, which in turn is formed as a result of oxidation of the gaseous molecular compound $Ta(OC_2H_5)_5$ adsorbed on the underlying SiON film layer, as explained with reference to FIG. 2. As a result of the decrease of the incubation time depending on the quality of the underlying film, the variation of the incubation time itself is reduced, and the variation of the thickness of the $Ta_2O_5$ film 13 thus formed by the CVD process is also reduced.

In the present invention, it should be noted that the gaseous molecular compound usable for forming the $Ta_2O_5$ molecular layer 12c is not limited to $Ta(OC_2H_5)_5$ but it is also possible to use $TaCl_5$. When $TaCl_5$ is used, the adsorption process may be conducted by setting the internal pressure of the reaction vessel to 0.133–13.3 Pa (0.001–00.1 Torr) and by supplying the $TaCl_5$ gas with a flow rate of 0.1–5 mg/min while maintaining the substrate temperature of 200–300° C.

Further, the present invention is not limited to the process of forming a $Ta_2O_5$ film but may be applicable also for forming various oxide films including a $SiO_2$ film, a $ZrO_2$ film, a $HfO_2$ film or an $Al_2O_3$ film as summarized in FIGS. 5 and 6, wherein it should be noted that FIG. 5 summarizes the process condition for the adsorption process and oxidizing process corresponding respectively to the steps of FIGS. 1F and 1G; for the foregoing oxides, while FIG. 6 summarizes the process condition for the CVD process corresponding to the step of FIG. 1H.

Referring to FIG. 5, it can be seen that the atmosphere used for oxidizing or causing hydrolysis reaction in the step of FIG. 1F for forming the $Ta_2O_5$ molecular layer 12c from the adsorbed $Ta(OC_2H_5)_5$ molecules or $TaCl_2$ molecules is not limited to the $O_2$ atmosphere, but other oxidizing atmospheres including a $H_2O$ atmosphere, a $NO_2$ atmosphere or an $O_3$ atmosphere may also be used. In the event the oxidizing atmosphere of FIG. 1G is conducted in the $O_2$ atmosphere as explained before, it is preferable to set the internal pressure of the reaction vessel to 0.133–1330 Pa (0.01–10 Torr) and the substrate temperature of 300–400° C. In the event the oxidizing step of FIG. 1F is to be conducted in the O3 atmosphere, on the other hand, it is preferable to set the internal pressure of the reaction vessel to 0.133–1330 Pa (0.001–10 Torr) and the substrate temperature to 200–300° C.

As can be seen in FIG. 5, it is also possible to form a $ZrO_2$ molecular layer in place of the $Ta_2O_5$ molecular layer 12c by adsorbing a gaseous molecular compound of Zr such as $Zr(t-OC_4H_9)_4$ or $ZrCl_4$ on the $SiO_2$ molecular layer 12a in the step of FIG. 1F and oxidizing the same under a similar condition as in the case of using the Ta gaseous molecular compound in the step of FIG. 1F. Similarly, it is also possible to form a $HfO_2$ molecular layer by adsorbing a gaseous molecular compound of Hf such as $Hf(t-OC_4H_9)_4$ or $HfCl_4$ on the $SiO_2$ molecular layer 12a and oxidizing the same under a similar condition as in the case of forming the $Ta_2O_5$ molecular layer. Further it is possible to form an $Al_2O_3$ molecular layer in place of the $Ta_2O_5$ molecular layer 12c by adsorbing a gaseous molecular compound of Al such as $Al(i-OC_3H_7)_3$ or $(CH_3)_3Al$ on the $SiO_2$ molecular layer 12a and oxidizing the same under a similar condition as in the case of forming the $Ta_2O_5$ molecular layer.

It is also possible to form the molecular layer 12c from $SiO_2$ by adsorbing $Si(OC_2H_5)_4$ or $SiCl_4$ or $SiH_2Cl_2$ on the $SiO_2$ molecular layer 12a under the condition similar to that of the $Ta_2O_5$ molecular layer and further causing oxidation or hydrolysis in the gaseous molecular compound of Si thus absorbed under a similar condition.

Further, by conducting a CVD process on the oxide molecular layer 12c thus formed under the condition summarized in FIG. 6, it becomes possible to form a CVD film of various oxides including $Ta_2O_5$, $ZrO_2$, $HfO_2$, $SiO_2$ and $Al_2O_3$ as the CVD film 13.

[Second Embodiment]

Figure 7:
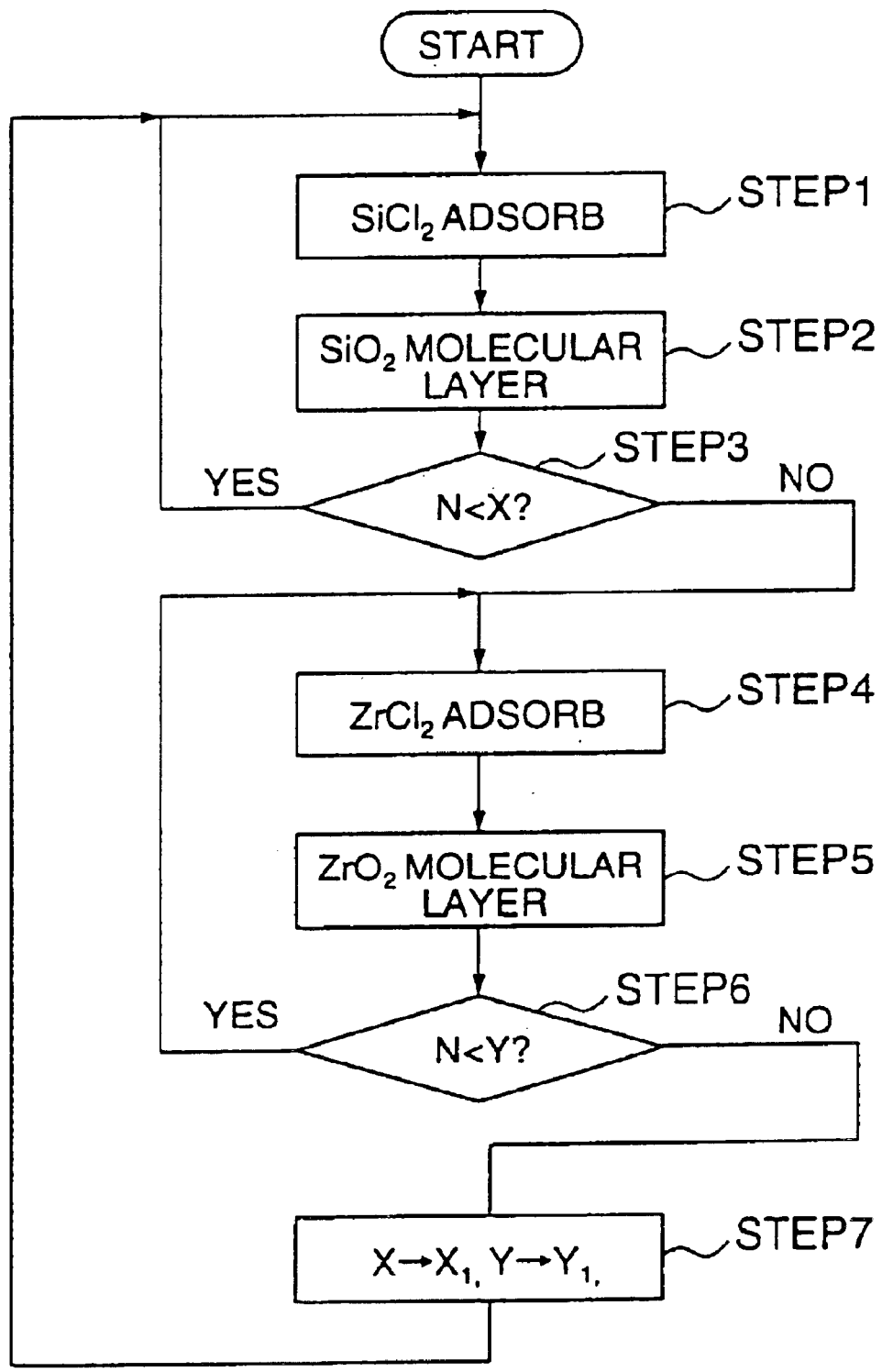
FIG. 7 is a flowchart showing the process of forming a dielectric film according to a second embodiment of the present invention.

FIG. 7 shows the process of forming a dielectric film according to a second embodiment of the present invention in the form of flowchart.

Referring to FIG. 7, the gaseous molecules of $SiCl_4$ are adsorbed on the $SiO_2$ molecular layer 12a represented in FIG. 1D in the step S1, and the $SiCl_4$ molecules thus adsorbed are subjected to an oxidation or hydrolysis reaction in the step S2. As a result, there is formed a molecular layer of $SiO_2$ on the substrate 11.

The foregoing steps S1 and S2 are repeated alternately a predetermined times X in the next step S3, and the process proceeds further to the step S4 corresponding to the process steps of FIGS. 1E and 1F in which the molecules of $ZrCl_4$ or $Zr(t-OC_4H_9)_4$ are adsorbed on the $SiO_2$ molecular layer formed in the previous steps S1 and S2.

The gaseous molecular compound of Zr thus adsorbed are then subjected to an oxidation or hydrolysis reaction in the next step S5 corresponding to the process step of FIG. 1G, and there is formed a molecular layer of $ZrO_2$ on the $SiO_2$ molecular layer. Further, the foregoing steps S4 and S5 are repeated alternately Y times in the next step S6, and the number of repetition X and Y are changed to X1 and Y1 respectively in the next step S7.

After the step S7, the process returns to the step S1. Thus, by repeating the steps S1–S7 with the newly defined number of the repetition X1 and Y1, there is formed a dielectric film having a composition of $ZrSiO4$ on the Si substrate in such a manner that the proportion of Zr and Si changes continuously in the thickness direction of the layer as represented in FIG. 8, wherein FIG. 8 represents those parts corresponding to the parts described previously by corresponding reference numerals.

Figure 8:
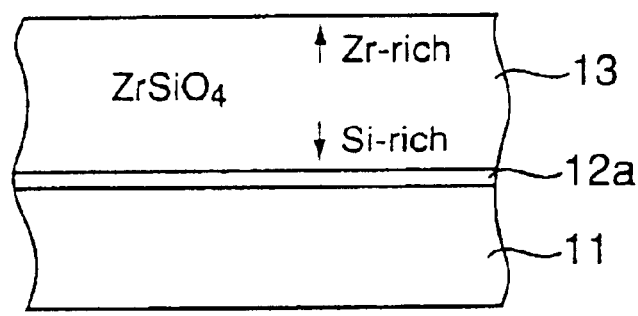
FIG. 8 is a diagram showing the structure of a dielectric film formed according to the second embodiment of the present invention.

Referring to FIG. 8, it can be seen that the Zr content in the dielectric film is controlled such that the Zr content is small in the vicinity of the interface to the Si substrate 11 and increases with increasing distance from the foregoing interface. In the $ZrSiO_4$ film having such a compositional profile, there is an advantageous feature, associated with the increased Si content in the vicinity of the interface to the Si substrate, of improved adherence. Further, in view of the fact that the large Zr content in the vicinity of the surface of the $ZrSiO_4$ film, the leakage current through the dielectric film is suppressed effectively. Further, it is possible to form the $ZrSiO_4$ film such that a Zr atom and a Si atom are repeated alternately in the thickness direction in every one molecular layer in the $ZrSiO_4$ film.

[Third Embodiment]

Figure 9:
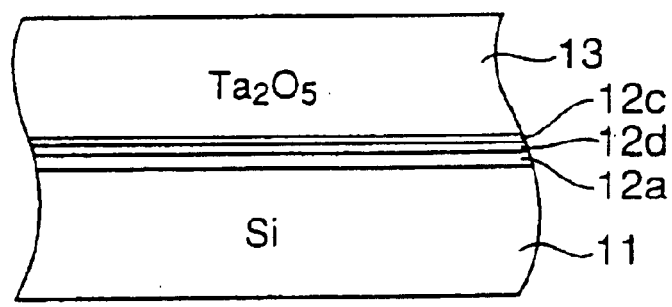
FIG. 9 is a diagram showing the structure of a dielectric film formed according to a third embodiment of the present invention.

FIG. 9 shows the structure of a dielectric film according to a third embodiment of the present invention, wherein those parts corresponding to the parts described previously are designated by the same reference numerals and the description thereof will be omitted.

Referring to FIG. 9, the present embodiment carries out adsorption of $SiCl_4$ molecules on the $SiO_2$ molecular layer 12a and the $SiCl_4$ molecules are converted to a molecular layer 12d of SiN by processing the adsorbed $SiCl_4$ molecules by an $NH_3$ gas. After the formation of the SiN molecular layer 12d, the $Ta(OC_2H_5)_5$ molecules are adsorbed on the layer 12d, and are converted to the $Ta_2O_5$ molecular layer 12c as a result of oxidation. Further, the CVD-$Ta_2O_5$ layer 13 is formed on the $Ta_2O_5$ molecular layer 12c.

In the structure of FIG. 9, it is possible to eliminate the problem of diffusion of B into the Si substrate by the SiN molecular layer 12d when a B-doped polysilicon film is deposited on the $Ta_2O_5$ film 13. It should be noted that the SiN molecular layer 12d interposed between the $Ta_2O_5$ film 13 and the Si substrate 11 effectively blocks the diffusion of B. Thus, the structure of FIG. 9 is effective for eliminating the variation of the threshold characteristic

[Fourth Embodiment]

Figure 10:
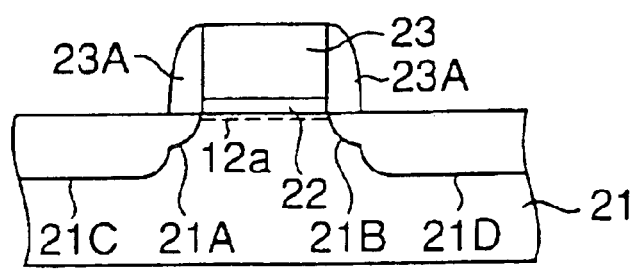
FIG. 10 is a diagram showing the construction of a semiconductor device according to a fourth embodiment of the present invention.

FIG. 10 shows the construction of a semiconductor device according to a fourth embodiment of the present invention.

Referring to FIG. 10, there is formed a gate insulation film 22 of $Ta_2O_5$ on a p-type substrate according to a process described in any of the preceding embodiments, and a polysilicon gate electrode 23 is formed on the gate insulation film 22.

Further, the Si substrate 21 is formed with diffusion regions 21A and 21B of $n^-$-type adjacent to the gate electrode 23, and sidewall insulation films 23a and 23b are provided on respective sidewalls of the polysilicon gate electrode 23. Further, diffusion regions 21C and 21D of $n^+$-type are formed outside of the sidewall insulation films 23a and 23b respectively.

In the semiconductor device of FIG. 10, an effective film thickness electrically equivalent to a SiO2 film having a thickness of 0.1 nm or less is realized by using $Ta_2O_5$ for the gate insulation film 22, and a ultrahigh-speed operation is achieved by reducing the gate length while simultaneously suppressing the gate leakage current. By forming the $Ta_2O_5$ film 22 according to the process described in any of the preceding embodiments, it becomes possible to minimize the variation of the film thickness and the semiconductor device thus formed has reliable and reproducible characteristics. Particularly, it is possible to block the diffusion of the impurity element from the gate electrode 12 to the Si substrate 21 by intervening a molecular layer 12d of SiN right underneath the $Ta_2O_5$ film 22 with a thickness of several molecular layers.

By forming the gate insulation film 22 in the form of stacking of molecular layers of various oxides including Ta2O5, it is possible to control the compositional profile inside the gate insulation film 22 in the thickness direction thereof as desired. As a result, a structure having excellent adhesion to the Si substrate can be formed easily for the gate insulation film, such that the gate insulation film has a large specific dielectric constant at the interface to the gate electrode 23.

As the forgoing process of forming the dielectric molecular film on the substrate is achieved by a hydrolysis reaction of the adsorbed gaseous source molecules in the present invention contrary to the conventional process of the Japanese Laid-Open Patent Publication 11-97341, which uses plasma-excited radicals, it becomes possible to avoid the problem pertinent to the foregoing prior art of the charged particles incorporated into the dielectric film forming a leakage current path, is successfully avoided. As there occur only thermally stable reactions in the hydrolysis process, the control of such a hydrolysis reaction is made easily.

Further, the present invention is not limited to the embodiments described heretofore, but various variations and modifications may be made without departing from the scope of the invention.

INDUSTRIAL APPLICABILITY

According to the present invention, it becomes possible to form a dielectric or high-dielectric film of various compositions including $Ta_2O_5$ on a Si substrate by a CVD process with reduced incubation time. As a result, the uniformity of the obtained dielectric film is improved. Further, the present invention enables arbitrary control of composition of the dielectric film in the thickness direction thereof. According to the needs, it is also possible to form an extremely thin diffusion barrier film of about a single molecular layer thickness in the dielectric film. In view of the fact that the present invention does not include the step of using plasma-excited radicals, the dielectric film thus formed according to the process of the present invention is substantially free form defects having electric charges such as impurity states, and excellent leakage characteristics can be attained. As a result of the present invention, a ultrafine and ultrahigh-speed semiconductor device having a gate length of 0.1 μm or less can be formed while successfully suppressing the gate leakage current.

What is claimed is:

1. A method of forming a dielectric film on a Si substrate, comprising the steps of:

exposing a surface of said Si substrate;

forming an insulating layer on said exposed surface of said Si substrate;

causing an adsorption of a gaseous molecular compound of a metal element constituting a dielectric material at least once on a surface of said insulating layer, such that said gaseous molecular compound covers substantially uniformly over said insulating layer; and forming a molecular layer of said dielectric material containing said metal element on said insulating layer, by causing a hydrolysis of said gaseous molecular compound covering said insulating layer.

2. A method as claimed in claim 1, wherein said dielectric material comprises $Ta_2O_5$ and wherein said gaseous molecular compound comprises any of $Ta(OC_2H_5)_5$ and $TaCl_5$.

3. A method as claimed in claim 1, wherein said dielectric material comprises $ZrO_2$ and wherein said gaseous molecular compound comprises any of $Zr(t\text{-}OC_4H_9)_4$ and $ZrCl_4$.

4. A method as claimed in claim 1, wherein said dielectric material comprises $HfO_2$ and wherein said gaseous molecular compound comprises any of $Hf(t\text{-}OC_4H_9)_4$ and $HfCl_4$.

5. A method as claimed in claim 1, wherein said dielectric material comprises $Al_2O_3$ and wherein said gaseous molecular compound comprises any of $Al(i\text{-}OC_3H_7)_3$ and $(CH_3)_3Al$.

6. A method as claimed in claim 1, wherein said step of forming said insulating layer comprises the steps of: covering said exposed surface of said Si substrate substantially uniformly by a gaseous molecular compound of Si at least once, by adsorbing said gaseous molecular compound of Si on said exposed surface of said Si substrate; and causing a hydrolysis of said gaseous molecular compound of Si, said gaseous molecular compound of Si being selected from the group consisting of $SiCl_4$, $SiH_2Cl_2$ and $Si(C_2H_5)_4$.

7. A method as claimed in claim 1, wherein said step of forming said insulating layer on said Si substrate comprises the step of applying a thermal oxidation process to said exposed surface of said Si substrate.

8. A method as claimed in claim 1 further comprising the step of forming, after said step of hydrolysis, a high-dielectric film on said molecular layer of said dielectric material by a CVD process.

9. A method as claimed in claim 1, wherein said step of forming said molecular layer of said dielectric material comprises the step of forming a dielectric film having a composition represented as $ZrSiO_4$, such that said dielectric film has a low Zr concentration level at an interface to said Si substrate and such that said Zr concentration level increases with increasing distance from said interface.

10. A method as claimed in claim 9, wherein said step of forming said dielectric film comprises the steps of forming a $SiO_2$ molecular layer and a $ZrO_2$ molecular layer consecutively, said step of forming said $SiO_2$ molecular layer comprising the steps of: adsorbing molecules of a first gaseous source material containing Si on an underlying layer; and decomposing said adsorbed molecules of said first gaseous source material, said step of forming said $ZrO_2$ molecular layer comprising the steps of: adsorbing molecules of a second gaseous source material containing Zr on an underlying layer; and decomposing said adsorbed molecules of said second gaseous source material.

11. A method of forming a dielectric film on a Si substrate, comprising the steps of:
    exposing a surface of said Si substrate;
    forming an insulating layer on said exposed surface of said Si substrate;
    causing an adsorption of a gaseous molecular compound of a metal element constituting a dielectric material at least once on said insulating layer, such that said gaseous molecular compound covers substantially uniformly over said insulating layer; and
    forming a molecular layer of said dielectric material containing said metal element on said insulating layer, by causing a pyrolytic decomposition of said gaseous molecular compound covering said insulating layer,
    said step of causing a pyrolytic decomposition comprising the step of heating said Si substrate to a temperature exceeding a pyrolytic decomposition temperature of said gaseous molecular compound in an oxidizing atmosphere.

12. A method as claimed in claim 11, wherein said dielectric material comprises $Ta_2O_5$ and wherein said gaseous molecular compound comprises any of $Ta(OC_2H_5)_5$ and $TaCl_5$.

13. A method as claimed in claim 11, wherein said dielectric material comprises $ZrO_2$ and wherein said gaseous molecular compound comprises any of $Zr(t-OC_4H_9)_4$ and $ZrCl_4$.

14. A method as claimed in claim 11, wherein said dielectric material comprises $HfO_2$ and wherein said gaseous molecular compound comprises any of $Hf(t-OC_4H_9)_4$ and $HfCl_4$.

15. A method as claimed in claim 11, wherein said dielectric material comprises $Al_2O_3$ and wherein said gaseous molecular compound comprises any of $Al(i-OC_3H_7)_3$ and $(CH_3)_3Al$.

16. A method as claimed in claim 11, wherein said step of forming said insulating layer comprises the steps of: covering said exposed surface of said Si substrate substantially uniformly by a gaseous molecular compound of Si at least once, by adsorbing said gaseous molecular compound of Si on said exposed surface of said Si substrate; and causing a hydrolysis of said gaseous molecular compound of Si, said gaseous molecular compound of Si being selected from the group consisting of $SiCl_4$, $SiH_2Cl_2$ and $Si(C_2H_5)_4$.

17. A method as claimed in claim 11, wherein said step of forming said insulating layer on said Si substrate comprises the step of applying a thermal oxidation process to said exposed surface of said Si substrate.

18. A method as claimed in claim 11 further comprising the step of forming, after said step of pyrolytic decomposition, a high-dielectric film on said molecular layer of said dielectric material by a CVD process.

19. A method as claimed in claim 11, wherein said step of forming said molecular layer of said dielectric material comprises the step of forming a dielectric film having a composition represented as $ZrSiO_4$, such that said dielectric film has a low Zr concentration level at an interface to said Si substrate and such that said Zr concentration level increases with increasing distance from said interface.

20. A method as claimed in claim 19, wherein said step of forming said dielectric film comprises the steps of forming a $SiO_2$ molecular layer and a $ZrO_2$ molecular layer consecutively, said step of forming said $SiO_2$ molecular layer comprising the steps of: adsorbing molecules of a first gaseous source material containing Si on an underlying layer; and decomposing said adsorbed molecules of said first gaseous source material, said step of forming said $ZrO_2$ molecular layer comprising the steps of: adsorbing molecules of a second gaseous source material containing Zr on an underlying layer; and decomposing said adsorbed molecules of said second gaseous source material.

21. A method of forming a dielectric film on a Si substrate, comprising the steps of:
    exposing a surface of said Si substrate;
    forming an insulating layer on said exposed surface of said Si substrate;
    causing an adsorption of a gaseous molecular compound of a metal element constituting a dielectric material at least once on said insulating layer, such that said gaseous molecular compound covers substantially uniformly over said insulating layer; and
    forming a molecular layer of said dielectric material containing said metal element on said insulating layer, by exposing said gaseous molecular compound to an atmosphere selected from the group consisting of $H_2O$, $O_3$ and $NO_2$.

22. A method as claimed in claim 21, wherein said dielectric material comprises $Ta_2O_5$ and wherein said gaseous molecular compound comprises any of $Ta(OC_2H_5)_5$ and $TaCl_5$.

23. A method as claimed in claim 21, wherein said dielectric material comprises $ZrO_2$ and wherein said gaseous molecular compound comprises any of $Zr(t-OC_4H_9)_4$ and $ZrCl_4$.

24. A method as claimed in claim 21, wherein said dielectric material comprises $HfO_2$ and wherein said gaseous molecular compound comprises any of $Hf(t-OC_4H_9)_4$ and $HfCl_4$.

25. A method as claimed in claim 21, wherein said dielectric material comprises $Al_2O_3$ and wherein said gaseous molecular compound comprises any of $Al(i-OC_3H_7)_3$ and $(CH_3)_3Al$.

26. A method as claimed in claim 21, wherein said step of forming said insulating layer comprises the steps of: covering said exposed surface of said Si substrate substantially uniformly by a gaseous molecular compound of Si at least once, by adsorbing said gaseous molecular compound of Si on said exposed surface of said Si substrate; and causing a hydrolysis of said gaseous molecular compound of Si, said gaseous molecular compound of Si being selected from the group consisting of $SiCl_4$, $SiH_2Cl_2$ and $Si(C_2H_5)_4$.

27. A method as claimed in claim 21, wherein said step of forming said insulating layer on said Si substrate comprises the step of applying a thermal oxidation process to said exposed surface of said Si substrate.

28. A method as claimed in claim 21 further comprising the step of forming, after said step of exposure to said atmosphere, a high-dielectric film on said molecular layer of said dielectric material by a CVD process.

29. A method as claimed in claim 21, wherein said step of forming said molecular layer of said dielectric material comprises the step of forming a dielectric film having a composition represented as $ZrSiO_4$, such that said dielectric film has a low Zr concentration level at an interface to said Si substrate and such that said Zr concentration level increases with increasing distance from said interface.

30. A method as claimed in claim 29, wherein said step of forming said dielectric film comprises the steps of forming a $SiO_2$ molecular layer and a $ZrO_2$ molecular layer consecutively, said step of forming said $SiO_2$ molecular layer comprising the steps of: adsorbing molecules of a first gaseous source material containing Si on an underlying layer; and decomposing said adsorbed molecules of said first gaseous source material, said step of forming said $ZrO_2$ molecular layer comprising the steps of: adsorbing molecules of a second gaseous source material containing Zr on an underlying layer; and decomposing said adsorbed molecules of said second gaseous source material.

* * * * *